United States Patent
Goel et al.

(10) Patent No.: US 8,745,472 B2
(45) Date of Patent: Jun. 3, 2014

(54) MEMORY WITH SEGMENTED ERROR CORRECTION CODES

(75) Inventors: Manish Goel, Plano, TX (US); Dongsuk Jeon, Ann Arbor, MI (US)

(73) Assignee: Texas Instruments Incorporated, Dallas, TX (US)

( * ) Notice: Subject to any disclaimer, the term of this patent is extended or adjusted under 35 U.S.C. 154(b) by 158 days.

(21) Appl. No.: 13/602,116

(22) Filed: Sep. 1, 2012

(65) Prior Publication Data

US 2014/0068391 A1 Mar. 6, 2014

(51) Int. Cl.
*H03M 13/00* (2006.01)

(52) U.S. Cl.
USPC ............................ 714/785; 714/796

(58) Field of Classification Search
CPC .............. H03M 13/151; H03M 13/451; G06F 11/1048
USPC .......... 714/767, 764, 780, 782, 752, 785, 796
See application file for complete search history.

(56) References Cited

U.S. PATENT DOCUMENTS

| | | | |
|---|---|---|---|
| 4,509,172 A | 4/1985 | Chen | |
| 4,556,977 A | 12/1985 | Olderdissen et al. | |
| 5,922,080 A * | 7/1999 | Olarig | 714/767 |
| 6,615,387 B1 * | 9/2003 | Williamson et al. | 714/785 |
| 7,039,854 B1 * | 5/2006 | Ireland et al. | 714/785 |
| 7,895,502 B2 * | 2/2011 | Han et al. | 714/764 |
| 8,301,984 B1 * | 10/2012 | Zhang et al. | 714/780 |
| 8,468,432 B2 * | 6/2013 | Yang | 714/782 |
| 8,650,450 B2 * | 2/2014 | Scarpa et al. | 714/752 |

OTHER PUBLICATIONS

I. Boyarinov et al, "Random double-bit error-correcting decomposable codes", Electronic Letters, vol. 37, No. 4, Feb. 15, 2001, pp. 228-229.
Goel, Manish, "Extended Bidirectional Hamming Code for Double-Error Correction and Triple-Error Detection", U.S. Appl. No. 13/305,126, filed Nov. 28, 2011, pp. 1-31.

* cited by examiner

*Primary Examiner* — David Ton
(74) *Attorney, Agent, or Firm* — John R. Pessetto; Wade J. Brady, III; Frederick J. Telecky, Jr.

(57) ABSTRACT

A code word is received that was derived from a plurality of smaller code words that represent a data word of $2^m$ data bits and a plurality of error correction code bits. The code word is converted into the plurality of smaller code words and syndromes are computed by multiplying each of the plurality of smaller code words by a check matrix. The syndrome words are processed to determine a number of errors that exist in each of the plurality of smaller code words. A portion of the syndrome words is processed to determine locations of possible errors within the plurality of smaller code words. Up to two errors may be corrected and up to three errors may be detected in the code word by using the number of errors and the locations of possible errors to determine erroneous bits in the code word.

20 Claims, 7 Drawing Sheets

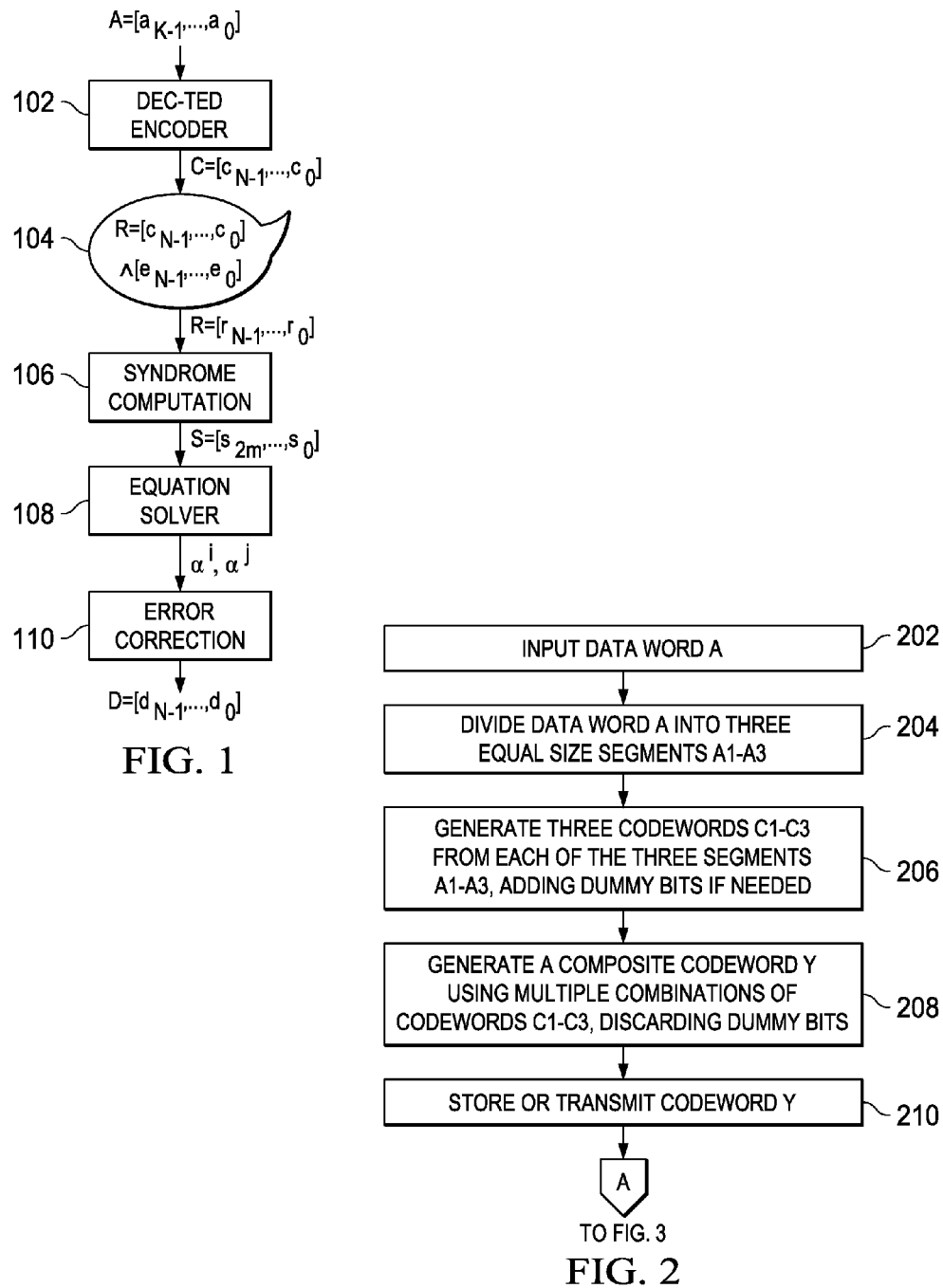

MEMORY WITH SEGMENTED ERROR CORRECTION CODES

FIELD OF THE INVENTION

This invention generally relates to memory error correction, and in particular to a memory with double error correction and triple error detection.

BACKGROUND OF THE INVENTION

Error detection and error correction are techniques that enable reliable delivery of digital data. Error detection techniques allow detecting such errors while error correction enables reconstruction of the original data. Errors in digital data may occur during transmission of digital data over a communications channel or may occur in a memory element. For example, the failure of on-chip memory cells is increasing in part due to the small feature sizes used in the fabrication of integrated circuit.

There are several ways that information (addresses, data, commands, responses) may be encoded to correct error(s) that occur. For example, an Error Correcting Code (ECC) may be used. ECC is a code in which data being transmitted or written conforms to specific rules of construction so that departures from this construction in the received or read data may be detected and/or corrected. Some ECC codes can detect a certain number of bit errors and correct a smaller number of bit errors. Codes which can correct one error are termed single error correcting (SEC), and those which detect two are termed double error detecting (DED). A Hamming code, for example, may correct single-bit errors and detect double-bit errors (SEC-DED). More sophisticated codes correct and detect even more errors. Examples of error correction code include Hamming code, Reed-Solomon code, Reed-Muller code and Binary Golay code.

Additional circuitry is needed to implement ECC on an integrated circuit. The additional circuitry increases the time required to write and read data to and from a memory array. Increasing the times to read and write to a memory array can slow the performance of an integrated circuit. Therefore it is important to keep the increase in time due to additional circuitry being added for ECC to a minimum.

System on Chip (SoC) is a concept that has been around for a long time; the basic approach is to integrate more and more functionality into a given device. This integration can take the form of either hardware or solution software. Performance gains are traditionally achieved by increased clock rates and more advanced process nodes. Many SoC designs pair a digital signal processor (DSP) with a reduced instruction set computing (RISC) processor to target specific applications. A more recent approach to increasing performance has been to create multi-core devices. Large blocks of memory are typically included which may include error detection and correction capability.

BRIEF DESCRIPTION OF THE DRAWINGS

Particular embodiments in accordance with the invention will now be described, by way of example only, and with reference to the accompanying drawings:

FIG. 1 is a flow diagram illustrating a method of encoding and decoding a data word using a single codeword segment for double error correction and triple error detection;

FIG. 2 is a flow chart illustrating encoding a data word using multiple codeword segments for double error correction and triple error detection;

Figure 3:
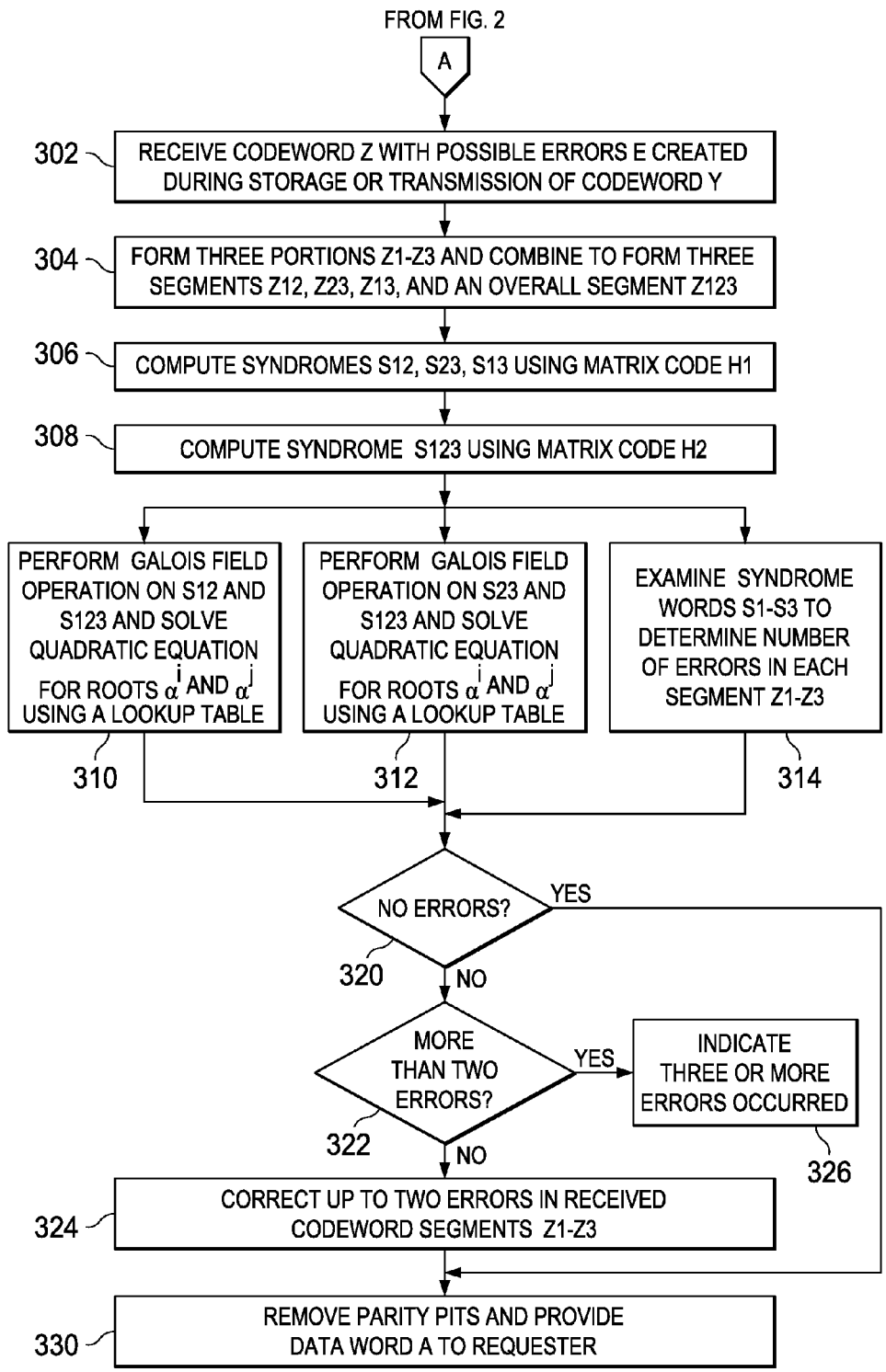
FIG. 3 is a flow chart illustrating decoding a codeword that was encoded using multiple codeword segments.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

With shrinking size of memory bit cells (for volatile and non-volatile storage), memory read, write and retention are more likely to be error-prone. Error correction is commonly used to compensate for these errors. In many use cases, such as on-chip flash and FRAM (ferroelectric random access memory) as well cache memory cells, single bit error correction is not enough. There is a need for two-bit error correction. As designs move to two-bit error correction, the critical path timing for the decoder circuit increases considerably as compared to one-bit error correction, which is most commonly based on Hamming code. Typically, this increase in critical path timing is 3-4 times that of single bit error correction. Therefore, there is a need to find new methods to reduce the critical path for the decoder An encoding method and corresponding decoder architecture for double error correcting and triple error detecting (DEC-TED) is described herein that reduces the critical path timing of the decoder logic. This is achieved by splitting the original input codeword into three segments of approximate size K/3 each, where the size of the original data word is $K=2^m$. Each of these are then encoded separately first and then combined with a simple XOR combination of circuits. The resultant combined codeword is then stored in memory or transmitted to a remote location. When the combined codeword is accessed from the memory or received at the remote location, it is decoded. At the decoder, the combined codeword is first decomposed by reverse XOR operations to recover the original three segments and then each of the segments are decoded to detect for one or two errors.

A low-complexity and fast double error correction code for memory subsystems will be described herein. Typically, for protecting a memory with word width of $2^m$ bits, a finite field of size $2^{(m+1)}$ is used in a BCH (Bose-Chaudhuri-Hocquenghem) code. By splitting the input word into multiple sections, a lower finite field size can be used, thus reducing size of the arithmetic components in the decoder and permitting a shorter critical timing path which allows faster decoding operation. For example, when the input data word is split up into three segments, a finite field of size $2^{(m-1)}$ can be used.

Embodiments of the invention may include a coding method and corresponding decoder architecture that differs from typical BCH (Bose-Chaudhuri-Hocquenghem) coding theory. For the typical BCH solution, for DEC-TED code, the number of coded bits are $2^m+2m+3$. In comparison, embodiments of the present invention may produce a number of coded bits equal to $2^m+3m-2$, as illustrated in Table 1.

TABLE 1

Comparison of number of coded bits

| m | Word Size K | Prior BCH N | New three-segment N |
|---|---|---|---|
| 5 | 32 | 45 | 45 |
| 6 | 64 | 79 | 80 |
| 7 | 128 | 145 | 147 |
| 8 | 256 | 275 | 278 |
| 9 | 512 | 533 | 537 |
| 10 | 1024 | 1047 | 1052 |

BCH codes require 5 consecutive roots for DEC-TED which requires distance 6. For a standard BCH code, also called narrow-sense BCH code, the following roots are used: alpha^0, alpha^1, alpha^2, alpha^3, alpha^4. (the notation alpha^1 means the same as $\alpha^1$). Out of these, alpha^2 and alpha^4 are implied since alpha^1 is a root. Therefore, standard BCH code typically uses alpha^0, alpha^1 and alpha^3 as fundamental roots.

A new encoding system was described in U.S. patent application Ser. No. 13/305,126, filed Nov. 28, 2011, entitled "Extended Bidirectional Hamming Code for Double-Error Correction and Triple-Error Detection" and is incorporated by reference herein. Extended Bidirectional Hamming Code (EBHC) has roots as alpha^-2, alpha^-1, alpha^0, alpha^1, alpha^2. Out of these roots, alpha^-2 is implied because of alpha^-1 and alpha^2 is implied because of alpha^1, thus leaving alpha^-1, alpha^0 and alpha^1 as fundamental roots.

An improved version of EBHC will be described herein for multiple segment encoding. In this case, a second code matrix is used in segment three of a 3-segment decoder that has roots at alpha^0 and alpha^-1 instead of alpha^3. This not only simplifies decoder implementation for double bit error correction but also provides 3-bit error detection capability because of an additional root at alpha^0. Using alpha^-1 results in simplification of decoder hardware. Especially, quadratic equation for two errors can be solved without requiring a divider. This does not happen for any other root.

In an embodiment of the invention that will be described in more detail below, while an inverter and control block decides the number and locations of errors in a received codeword by examining three sets of syndrome bits derived from three sections of a received codeword, separate equation solvers and multipliers process each case in parallel. In this manner, the critical timing path of the decoder may be reduced. In this exemplary embodiment of a decoder core, each of the elements including look up tables and multiplier reduce from (m+1) bit to (m-1) bit, thus saving approximately 30% to 40% in critical path time delay for 16-64 bit data widths over a traditional BCH encoding scheme.

The encoding and decoding process for three-segment DEC-TED (Double Error Correction-Triple Error Detection) will now be described in more detail for one segment, and then the use of multiple segments in which a finite field of size $2^{(m-1)}$ may be used will be described. A branch in mathematics known as Galois field (GF) theory deals mainly with the analysis and formal description of binary operations upon polynomials. The binary extensions of Galois fields ($GF(2^m)$) are used extensively in digital logic circuitry. Addition and multiplication are common Galois operations. Multiplication in a finite field, such as a Galois field, is multiplication modulo a polynomial value used to define the finite field (i.e., it is multiplication followed by division using the polynomial value as the divisor). Operations upon elements in Galois fields are accomplished via bitwise operations such as XOR, AND, and OR operations. A bitwise operation operates on one or more bit patterns or binary numerals at the level of their individual bits. "ANDing", "XORing", "ORing" etc. refers to performing bitwise logical operations such as AND, XOR or OR logical operations on bit patterns.

FIG. 1 is a flow diagram illustrating a method of encoding and decoding a data word using a single codeword segment for double error correction and triple error detection. A code word C is generated 102 from a given data word A. Codes can be classified by the number of symbols k in a data word A where $k=2^{m-1}$. For example, a data word may be expressed by equation (1).

$$A=[a_{K-1}, a_{K-2}, \ldots, a_1 a_0] \qquad (1)$$

or by a polynomial expression of equation (2).

$$a(x)=a_{K-1}x^{K-1}+a_{K-2}x^{K-2}+\ldots+a_1 x+a_0. \qquad (2)$$

Often, codes words C are constructed by appending a parity word B with N-K=2m+1 check symbols (i.e. check bits) to the K message symbols to form an N-symbol code word C. The code word C is formed using a linear matrix transformation of equation (3).

$$C=AG \qquad (3)$$

where $C=[c_{N-1}, c_{N-2}, \ldots, c_1, c_0]$ is a 1×N row vector representing the n-symbol code word and G is a K×N matrix known as a generator matrix. The generator may also be expressed as a polynomial equation g(x). The parity word B may be expressed as a polynomial such as equation (4).

$$b(x)=\mathrm{mod}(x^{2m+1}a(x), g(x)) \qquad (4)$$

Although the symbols need not be bits, they are usually bits. In the following description, the symbols will be referred to as bits of an electronic storage medium or bits in an electronic communication channel.

An N-bit received code word R may be retrieved 104 either from an electronic storage medium or received over an electronic communications channel. The received code word R is given by the equation (5).

$$R=[r_{N-1}, r_{N-2}, \ldots, r_1, r_0]=[c_{N-1}, c_{N-2}, \ldots, c_1, c_0]$$
$$\oplus [e_{N-1} e_{N-2}, \ldots, e_1, e_0]. \qquad (5)$$

The error vector $E=[e_{N-1}, e_{N-2}, \ldots, e_1, e_0]$ represents any errors that may have occurred either during storage or transmission of the bits in the code word C. To determine whether the received word accurately represents the original code word C, the received word R is used to generate 106 a 2m+1-bit syndrome vector S using a matrix transformation of the form illustrated by equation (6).

$$S=HR^t \quad (6)$$

where $R^t$ is the transpose of an 1×N vector R.

The syndrome vector S is independent of the original code word C and a function only of the error vector E. A decoder uses the syndrome vector S to reconstruct the error vector E, which is subtracted from the received word R to regenerate the code word C.

A code is able to detect and correct errors based on the "Hamming distance" between words of the code. The Hamming distance between two code words is the number of symbols in which the two code words differ. When the minimum Hamming distance of a code is t+1, then the code can detect up to t errors. When the minimum Hamming distance of a code is 2t+2, the code can correct up to t errors and can also detect t+1 errors.

In order to correct 110 two errors and detect three errors, a Hamming code must have a minimum Hamming distance of six symbols. This type of code is usually referred to as double error correcting and triple error detecting (DEC-TED) code. Error correction codes capable of correcting double errors and detecting triple errors can be constructed based on the BCH (Bose-Chaudhuri-Hocquenghem) theory. For example, a primitive BCH DEC-TED code of length $n=2^m-1$ with 2m+1 check bits may be obtained with a parity check matrix, each column vector k of which consists of 1, $\alpha^k$ and $\alpha^{3k}$, where $\alpha$ is a primitive element of the finite field of $2^m$ elements. A more complex coding scheme is used by the embodiments herein, as will be described in more detail below. An equation solver 108 is used to solve the equations represented by the code in order to perform error correction 110.

FIG. 2 is a flow chart illustrating encoding a data word using multiple codeword segments for double error correction and triple error detection. In this example, an embodiment that uses three codeword segments will be explained. This embodiment includes a code with double error correction and triple error detection for a data word A of length $K=2^{m-1}$ bits. The code is called an Extended Bidirectional Hamming code (EBHC). A code word C may be constructed using a parity check matrix having the form of equation (7).

$$HC^t=0 \text{ where} \quad (7)$$

The check matrix for code 1 used for two of the segments is given by equation (8), while the check matrix for code 2 used for the third segment is given by equation (9).

$$H = \begin{bmatrix} 1 & \alpha & \ldots & \alpha^{N-1} \end{bmatrix} \quad (8)$$

$$H = \begin{bmatrix} 1 & 1 & \ldots & 1 \\ 1 & \alpha^{-1} & \ldots & \alpha^{-(N-1)} \end{bmatrix} \quad (9)$$

The finite field element a in the above matrices is a root of an irreducible polynomial over the Galois field $GF(2^m)$. The Galois field primitive polynomial is given equation (10).

$$p(x)=p_m x^m + p_{m-1} x^{m-1} + \ldots + p_1 x + p_0 \quad (10)$$

This Galois field primitive polynomial is a polynomial of degree m having binary coefficients. The generator polynomial g(x) for the Extended Bidirectional Hamming code is defined by equation (11)

$$g(x)=(x+1)p(x)\tilde{p}(x) \quad (11)$$

where $\tilde{p}(x)=p_0 x^m + p_1 x^{m-1} + \ldots + p_{m-1} x + p_0$.

A data word $A=[a_{K-1}, a_{K-2}, \ldots, a_1, a_0]$ may be represented by a polynomial such as equation (12).

$$a(x)=a_{K-1} x^{K-1} + a_{K-2} x^{K-2} + \ldots + a_1 x + a_0 \quad (12)$$

Parity word $B=[b_{2m}, b_{2m-1}, \ldots, b_1, b_0]$ has a code length of 2m+1 and may represented by a polynomial such as equation (13).

$$b(x)=b_{2m} x^{2m} + b_{2m-1} x^{2m-1} + \ldots + b_1 x + b_0 \quad (13)$$

b(x) is derived using equation (14)

$$b(x)=\text{mod}(x^{2m+1} a(x), g(x)) \quad (14)$$

The encoded word $C=[c_{N-1}, c_{N-2}, \ldots, c_1, c_0]$ may be represented by a polynomial such as equation (15).

$$c(x)=x^{2m+1} a(x)+b(x) \quad (15)$$

The polynomial expression for the encoded word C shown above has roots at 5 consecutive powers, −2, −1, 0, 1, 2, of the Galois field primitive element a (i.e. $\alpha^{-2}$, $\alpha^{-1}$, $\alpha$, $\alpha^1$, $\alpha^2$). Because the polynomial expression for the encoded word C shown above has roots at 5 consecutive powers, the extended bidirectional Hamming code has a minimum distance of six. Since the extended bidirectional Hamming code has a minimum distance of six, this code may be used to correct single and double errors and detect three errors.

Referring again to FIG. 2, a data word of length $2^m$ is input 202 to the encoding process. During decoding, by dividing the entire codeword of length $2^m$ into several segments and decoding each of them independently, the critical path delay of the decoder may be reduced due to smaller Galois field operations. The 3-segment BCH DEC-TED code may first divide 204 the incoming data A into three segments.

Case where m is Odd

When m is odd, a segmentation scheme illustrated in Table 2 may be used. Notice that when m is odd we use L such that $3L+2=2^m$, the three segments will have different lengths.

TABLE 2

| segmentation when m is odd |
|---|
| $A = [a_0, a_1, \ldots, a_{3L+1}]$ |
| $A1 = [a_0, a_1, \ldots, a_L]$ |
| $A2 = [a_{L+1}, a_{L+2}, \ldots, a_{2L+1}]$ |
| $A3 = [a_{2L+2}, a_{2L+3}, \ldots, a_{3L+1}]$ |

Length of segment A1=L+1, length of segment A2=L+1, and length of segment A3=L. Each of A1, A2 and A3 are then encoded 206 with BCH codes. A1 and A2 are encoded such that resulting codeword polynomials are divisible by generator polynomial $g1(x)=g2(x)=p(x)$ where p(x) is primitive polynomial for the Galois Field of order m−1. This may be done using the matrix of equation (8). A3 is encoded such that resulting codeword is divisible with a generating polynomial $g3(x)=x^{m-1}(1+x)p(1/x)$. This may be done using the matrix of equation (9). Then the codeword generated 206 for each segment is illustrated in Table 3.

TABLE 3

| codewords generated when m is odd |
|---|
| $C1 = [a_0, a_1, \ldots, a_L, b_{1,0}, b_{1,1}, b_{1,m-2}]$ |
| $C2 = [a_{L+1}, a_{L+2}, \ldots, a_{2L+1}, b_{2,0}, b_{2,1}, \ldots, b_{2,m-2}]$ |
| $C3 = [a_{2L+2}, a_{2L+3}, \ldots, a_{3L+1}, b_{3,0}, b_{3,1}, \ldots, b_{3,m-1}]$ |

Note that the number of parity bits generated by matrix (8) is m−1, while the number of parity bits generated by matrix (9) is m. Therefore, the resultant length of codeword C1=L+1+m−1=L+m; the resultant length of codeword C2=L+1+m−1=L+m; and the resultant length of codeword C3=L+m.

The final codeword may be generated 208 according to equation (16), since codewords C1, C2, and C3 are all the same length, were ⊕ indicates XOR.

$$Y = [C1_{0:L+m-1} \oplus C3_{0:L+m-1}, C2_{0:L+m-1} \oplus C3_{0:L+m-1}, C1_{0:L+m-1} \oplus C2_{0:L+m-1} \oplus C3_{0:L+m-1}] \quad (16)$$

Note that the resulting codeword has length N=3L+3m=2^m+3m−2.

Case where m is Even

When m is even, a segmentation scheme illustrated in Table 4 may be used. Notice that when m is even, a variable L may be selected such that 3L+1=2^m, and the resulting three segments will have different lengths.

TABLE 4 segmentation when m is odd $A = [a_0, a_1, \ldots, a_{3L}]$
$A1 = [a_0, a_1, \ldots, a_L]$
$A2 = [a_{2L+1}, a_{L+1}, a_{L+2}, \ldots, a_{2L}]$
$A3 = [a_{2L+1}, a_{2L+2}, \ldots, a_{3L}]$ Length of segment A1=L+1, length of segment A2=L+1, and length of segment A3=L. However, note the segment A2 is augmented with a dummy bit that in this example is denoted as $a_{2L+1}$, which is a repeat of a same bit in segment A3. Each of A1, A2 and A3 are then encoded 206 with BCH codes. A1 and A2 are encoded such that resulting codeword polynomials are divisible by generator polynomial $g1(x)=g2(x)=p(x)$ where p(x) is primitive polynomial for the Galois Field of order m−1. This may be done using the matrix of equation (8).

A3 is encoded such that resulting codeword is divisible with a generating polynomial $g3(x)=x^{m-1}(1+x)p(1/x)$. This may be done using the matrix of equation (9). Then the codeword generated 206 for each segment is illustrated in Table 5.

TABLE 5 codewords generated when m is even $C1 = [a_0, a_1, \ldots, a_L, b_{1,0}, b_{1,1}, \ldots, b_{1,m-2}]$
$C2 = [a_{2L+1}, a_{L+1}, 2_{L+2}, \ldots, a_{2L}, b_{2,0}, b_{2,1}, \ldots, b_{2,m-2}]$
$C3 = [a_{2L+1}, a_{2L+2}, \ldots, a_{3L}, b_{3,0}, b_{3,1}, \ldots, b_{3,m-1}]$ Note that the number of parity bits generated by matrix (8) is m−1, while the number of parity bits generated by matrix (9) is m. Therefore, the resultant length of codeword C1=L+1+m−1=L+m; the resultant length of codeword C2=L+1+m−1=L+m; and the resultant length of codeword C3=L+m.

The final codeword may be generated according to equation (16), since codewords C1, C2, and C3 are all the same length.

And the final codeword can be generated 208 according to equation (17), since codewords C1, C2, and C3 are all the same length. However, note that for the C2⊕C3 set, $C2_0 \oplus C3_0$ is not performed thereby discarding 208 the dummy bit that was inserted in C2 so that an extra bit it not stored or transmitted. $C2_0 \oplus C3_0$ will always be zero, since both terms are the same.

$$Y = [C1_{0:L+m-1} \oplus C3_{0:L+m-1}, C2_{1:L+m-1} \oplus C3_{1:L+m-1}, C1_{0:L+m-1} \oplus C2_{0:L+m-1} \oplus C3_{0:L+m-1}] \quad (17)$$

Note that the resulting codeword has length N=3L+3m−1=2^m+3m−2.

The resulting code word $Y=[Y_0, Y_1, \ldots Y_{2^m+3m-3}]$ may be stored 210 in electronic memory. Electronic memory may be corrupted for many reasons. For example, an alpha particle may strike the memory and change the digital value of the stored information. In addition, the code word $Y=[Y_0, Y_1, \ldots Y_{2^m+3m-3}]$ may also be transmitted 210 through a noisy environment that may also change the digital value of Y. Because the code word Y is encoded, some of these errors may be corrected and some of the errors may be detected as explained previously.

FIG. 3 is a flow chart illustrating decoding a received codeword Z that was encoded using multiple codeword segments; three segments are illustrated for the embodiment described herein. When the code word Z is either received 302 from a memory or received as a transmission and stored in a latch or other temporary storage location, a decoder may be used to determine if 1, 2 or 3 errors have occurred. In addition, the decoder may be used to determine where the 1 or 2 errors have occurred. The decoder may also be used to correct 1 or 2 errors. The received code word Z is similar to equation (5).

Syndrome bits S are used to detect and correct errors in the received codeword Z. In order to calculate the syndrome bits S, the received codeword Z is first converted back to the original 3-segment smaller codewords. For the case where m is odd, Table 6 illustrates generation 304 of three segments. Table 7 illustrates generation 304 of three segments for the case where m is even.

TABLE 6 generation of three segments from received codeword Z when m is odd $Z12 = [Z_{0:\ L+m-1} \oplus Z_{L+m:\ 2L+2m-1}]$
$Z23 = [Z_{L+m:\ 2L+2m-1} \oplus Z_{2L+2m:\ 3L+3m-1}]$
$Z13 = [Z_{0:\ L+m-1} \oplus Z_{2L+2m:\ 3L+3m-1}]$
$Z123 = [Z_{0:\ L+m-1} \oplus Z_{L+m:\ 2L+2m-1} \oplus Z_{2L+2m:\ 3L+3m-1}]$

TABLE 7 generation of three segments from received codeword Z when m is even $Z12 = [Z_0, Z_{1:\ L+m-1} \oplus Z_{L+m:\ 2L+2m-2}]$
$Z23 = [Z_{2L+2m-1}, Z_{L+m:\ 2L+2m-2} \oplus Z_{2L+2m-2} \oplus Z_{2L+2m:\ 3L+3m-2}]$
$Z13 = [Z_{0:\ L+m-1} \oplus Z_{2L+2m-1:\ 3L+3m-2}]$
$Z123 = [Z_0 \oplus Z_{2L+2m-1}, Z_{1:\ L+m-1} \oplus Z_{L+m:\ 2L+2m-2} \oplus Z_{2L+2m:\ 3L+3m-2}]$ Syndrome Computation Syndrome vectors $S_{12}$, $S_{23}$ and $S_{13}$ are calculated 306 using code matrix 1 represented by equation (18) multiplied by a corresponding segment codeword Z12, Z23, Z13. Syndrome vector $S_{123}$ is calculated 308 using code matrix 2 represented by equation (19) multiplied by the entire received codeword Z. $S_0$ is the parity of $Z_{123}$.

$$H = \lfloor 1 \quad \alpha \quad \ldots \quad \alpha^{L+m-1} \rfloor \quad (18)$$

$$H = \begin{bmatrix} 1 & 1 & \ldots & 1 \\ 1 & \alpha^{-1} & \ldots & \alpha^{-(L+m-1)} \end{bmatrix} \quad (19)$$

The syndromes are then examined 314 to determine how many errors have occurred.

Case A: No Error

If all of $S_0$, $S_{12}$, $S_{13}$, $S_{23}$ and $S_{123}$ are zero, the received codeword has no error 320 with weights up to three and it is directly sent 330 to the output without any changes, except for removing the parity bits.

When an error is detected, but more than two errors are not detected 322, then error correction may be performed.

Case B: One or Two Errors in Only One Segment

Errors in the first segment: If $S_{23}=0$, $S_{12}=S_{13}\neq 0$ and $S_{123}\neq 0$ then the received codeword has one error (location i) or two errors (locations i and j) in the first segment (For one error, $S_{12}=\alpha^i$, $S_{123}=\alpha^{-i}$ and for two errors, $S_{12}=\alpha^i+\alpha^j$, $S_{123}=\alpha^{-i}+\alpha^{-j}$). The location of errors can be found by the error locating polynomial by assigning $S_1=S_{12}$ and $S_{-1}=S_{123}$.

Errors in the second segment: if $S_{13}=0$, $S_{12}=S_{23}\neq 0$ and $S_{123}\neq 0$ then the received codeword has one error (location i) or two errors (locations i and j) in the second segment (For one error, $S_{12}=\alpha^i$, $S_{123}=\alpha^{-i}$ and for two errors, $S_{12}=\alpha^i+\alpha^j$, $S_{123}=\alpha^{-i}+\alpha^{-j}$). The location of errors can be found by the error locating polynomial by assigning $S_1=S_{12}$ and $S_{-1}=S_{123}$.

Errors in the third segment: if $S_{12}=0$, $S_{13}=S_{23}\neq 0$ and $S_{123}\neq 0$ then the received codeword has error (location i) or two errors (locations i and j) in the third segment (For one error, $S_{13}=\alpha^i$, $S_{123}=\alpha^{-i}$ and for two errors, $S_{13}=\alpha^i+\alpha^j$, $S_{123}=\alpha^{-i}+\alpha^{-j}$). The location of errors can be found by the error locating polynomial by assigning $S_1=S_{13}$ and $S_{-1}=S_{123}$.

Case C: Two Errors in Two Different Segments

Errors in the first segment at location i and second segment at location j: if $S_{13}=\alpha^i\neq 0$, $S_{23}=\alpha^j\neq 0$, $S_{12}=\alpha^i+\alpha^j=S_{13}+S_{23}$ and $S_{123}=\alpha^{-i}+\alpha^{-j}=1/S_{13}+1/S_{23}$, then the received codeword has two errors in the first and second segment, respectively. Then $S_{13}$ may be used to find out the location i of error in the first segment and $S_{23}$ to find out the location j of error in the second segment.

Errors in the first segment at location i and third segment at location j: if $S_{12}=\alpha^i\neq 0$, $S_{23}=\alpha^j\neq 0$, $S_{13}=\alpha^i+\alpha^j=S_{12}+S_{23}$ and $S_{123}=\alpha^{-i}+\alpha^{-j}=1/S_{12}+1/S_{23}$, then the received codeword has two errors in the first and third segment, respectively. Then $S_{12}$ may be used to find out the location i of error in the first segment and $S_{23}$ to find out the location j of error in the third segment.

Errors in the second segment at location i and third segment at location j: if $S_{12}=\alpha^i\neq 0$, $S_{13}=\alpha^j\neq 0$, $S_{23}=\alpha^i+\alpha^j=S_{12}+S_{13}$ and $S_{123}=\alpha^{-i}+\alpha^{-j}=1/S_{12}+1/S_{13}$, then the received codeword has two errors in the second and third segment, respectively. Then $S_{12}$ may be used to find out the location i of error in the second segment and $S_{13}$ to find out the location j of error in the third segment.

Case D: Three Errors

If none of the above cases are satisfied, then the detection of three errors is declared 326.

Error Location Determination

For the case when there are errors in a single segment, a single error is indicated by $S_1 S_{-1}=1$ and error location i is obtained from equation $S_1=\alpha^i$. The following equations are used for all the three cases when there are two errors in a single segment.

Two errors are located at i and j, then $\alpha^i$, and $\alpha^j$ and can be computed by quadratic equation (20).

$$x^2+x+1/(S_1 S_{-1})=0 \qquad (20)$$

where $x_1$ is a root of the above equation. The two error locations are given by equations (21).

$$\alpha^i=x_1 S_1 \text{ and } \alpha^j=S_1+\alpha^i \qquad (21)$$

Note that solution to quadratic equation, $x^2+x+1/(S_1 S_{-1})=0$, can be stored as a look up table storing two roots given the third term as function of syndromes. One special case occurs when $S_1 S_{-1}=1$ (same condition as the single error case) and m is an even value, the double error locations may be found by solving equation (22):

$$x^2+x+1=0. \qquad (22)$$

It can be shown that that equation (22) has a solution only if m is even and solution is given by equations (23)

$$x_1 = \alpha^{\left(\frac{2^m-1}{3}\right)} \qquad (23)$$
$$x_2 = \alpha^{2\left(\frac{2^m-1}{3}\right)}$$

To resolve this condition with the single error case, $S_0$ is used (i.e. if $S_0=1$ then there is a single error and if $S_0=0$ then there are two errors). This situation does not arise in the case where m is odd.

A Galois Field operation is performed 310 on S12 and S123 and the quadratic equation described above is solved for roots $\alpha^i$ and $\alpha^j$ using a lookup table. A Galois Field operation is performed 312 on S23 and S123 and the quadratic equation described above is solved for roots $\alpha^i$ and $\alpha^j$ using a lookup table. In this embodiment, computation and look up 310, computation and look up 312, and syndrome examination 314 are all performed in parallel in order to reduce the critical timing path of the decoded hardware.

When no errors are detected 320, than received codeword Z may be presented 330 directly to the requester, or the parity bits may be removed and original data word A may be presented 330 to the requester. Typically, the requester is a processing unit that is coupled to the memory in which codeword Y was stored. The requester may also be a communication interface that is receiving data via a communication channel.

When one or two errors are detected 322, the errors are corrected 324 as described above using the segment(s) indent identified by examining 314 the syndromes and using the locations within the segments identified by table lookup 310, 312.

When more than two errors are detected 322, an indication is provided 326 to the system that three or more errors have been detected. The system may then perform operations to overcome the error, such as retrying the memory access operation, requesting a retransmission over the communication channel, etc.

Figure 4:
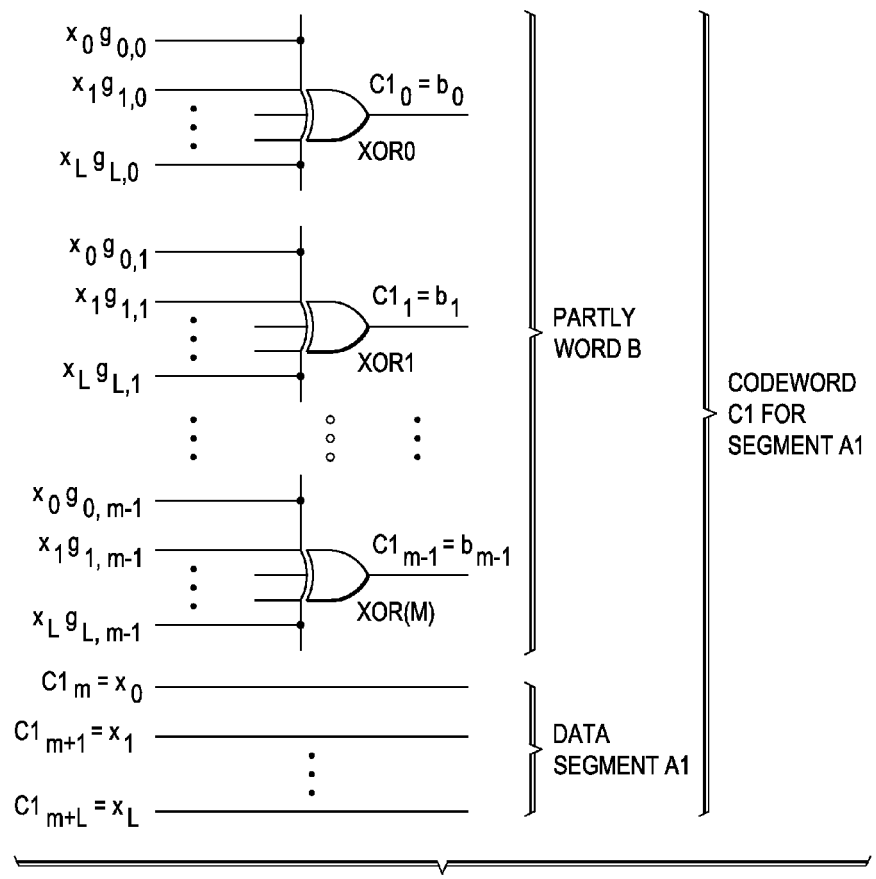
FIG. 4 is a schematic drawing of an embodiment of a code word generator using bit-wise XOR gates.

FIG. 4 is a schematic drawing of an embodiment of a code word generator using XOR gates for one of the segment C1 described above. Similar logic may provided for each of the other two segments to allow codeword generation for all three segments to be performed in parallel. In this example, the parity word $B1=[b_{1,0}, b_{1,1}, \ldots b_{1,m-3}, b_{1,m-2}]$ is generated on a bit-wise basis. The parity word B1 may be generated by equation (24), which is similar to equation (4).

$$b1(x)=\mod(x^{m-1}a1(x),g1(x)) \qquad (24)$$

The operation can also be represented in vector format as $B1=A1*G1$, where G1 is the generator matrix of size $(m-1)\times(L+1)$ for segment 1. Elements of G1 are obtained from $g1(x)$ where the first row of G1 is computed as $\mod(x^{L+m-1},g1(x))$, the second row of G1 is computed as $\mod(x^{L+m-2},g1(x))$, the third row of G is computed as $\mod(x^{L+m-3},g1(x))$, and so on, with the $(L+1)^{th}$ row of G1 computed as $\mod(x^{m-1},g1(x))$, and in general, the $j^{th}$ row computed as $\mod(x^{L+m-j},g1(x))$ where $j=1, 2, 3, \ldots L+1$. Parity word B1 is obtained via vector-matrix multiplication of A1 and G1.

In this embodiment, exclusive OR function XOR0 applies the products of $A1*G1$ on a bit-wise basis for column 0 with the output being equal to $b_{1,0}$ ($b_{1,0}$ is also equal to $B1_0$ of the parity word B1). Exclusive OR function XOR1 applies the products of $A1*G1$ on a bit-wise basis for column 1 with the output being equal to $b_{1,1}$ ($b_{1,1}$ is also equal to $B1_1$ of the parity word B1). Each subsequent XOR repeats this pattern until the last parity bit, $b_{1,m-2}$, is created. Exclusive OR function XORm applies the products of A1*G1 on a bit-wise basis for column j with the output being equal to $b_{1,j}$ ($b_{1,j}$ is also equal to $B1_j$ of the parity word B1).

Figure 5:
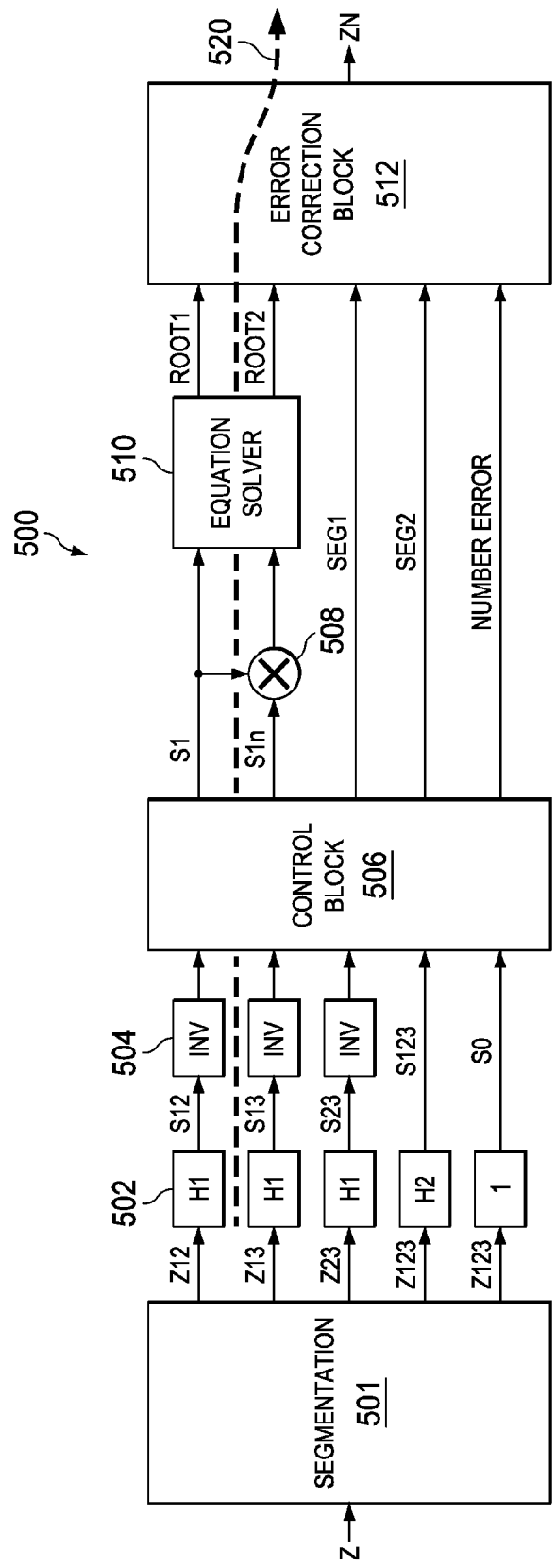
FIG. 5 is a block diagram of a decoder illustrating decoding a codeword that was encoded using three codeword segments.

Code word bits $C1_0$ through $C1_L$ are simply equal to data word bits $a_0$ through $a_L$. Code word bits $C1_{L+1}$ through $C1_{L+m-1}$ are equal to parity word bits $b_{1,0}$ through $b_{1,m-2}$ FIG. 5 is a block diagram of a decoder 500 illustrating decoding a codeword that was encoded using three codeword segments. In this architecture, each received codeword Z is segmented by segmentation module 501 as described above. All syndromes are computed first in the syndrome computation modules indicated generally at 502 using code matrix H1 and H2, as described in more detail above. Then $S_{12}$, $S_{13}$ and $S_{23}$ are inverted 504 and fed into controller 506 along with $S_{12}$, $S_{13}$, $S_{23}$, $S_{123}$, $S_0$ to determine the number of errors in each segment Z1-Z3, as described in more detail above.

After control block 506 decides the locations and number of errors, $S_1$ and $S_{-1}$ are set appropriately as described above and sent to the equation solver 510. The error correction block 512 searches for corresponding locations in the received codeword using the roots from equation solver 510 and information about erroneous segments from control block 506, as described in more detail above.

Although the equation solver 510 and Galois field multipliers 508 become smaller compared to the original BCH decoder described previously, this architecture may incur more overhead in critical timing paths. Therefore, the savings from smaller Galois field size is compromised by this overhead. The critical path 520 of this decoder is syndrome computation 502, inverter 504, control block 506, multiplier 508, equation solver 510, and error correction block 512 as indicated by the dotted line 520.

Figure 6:
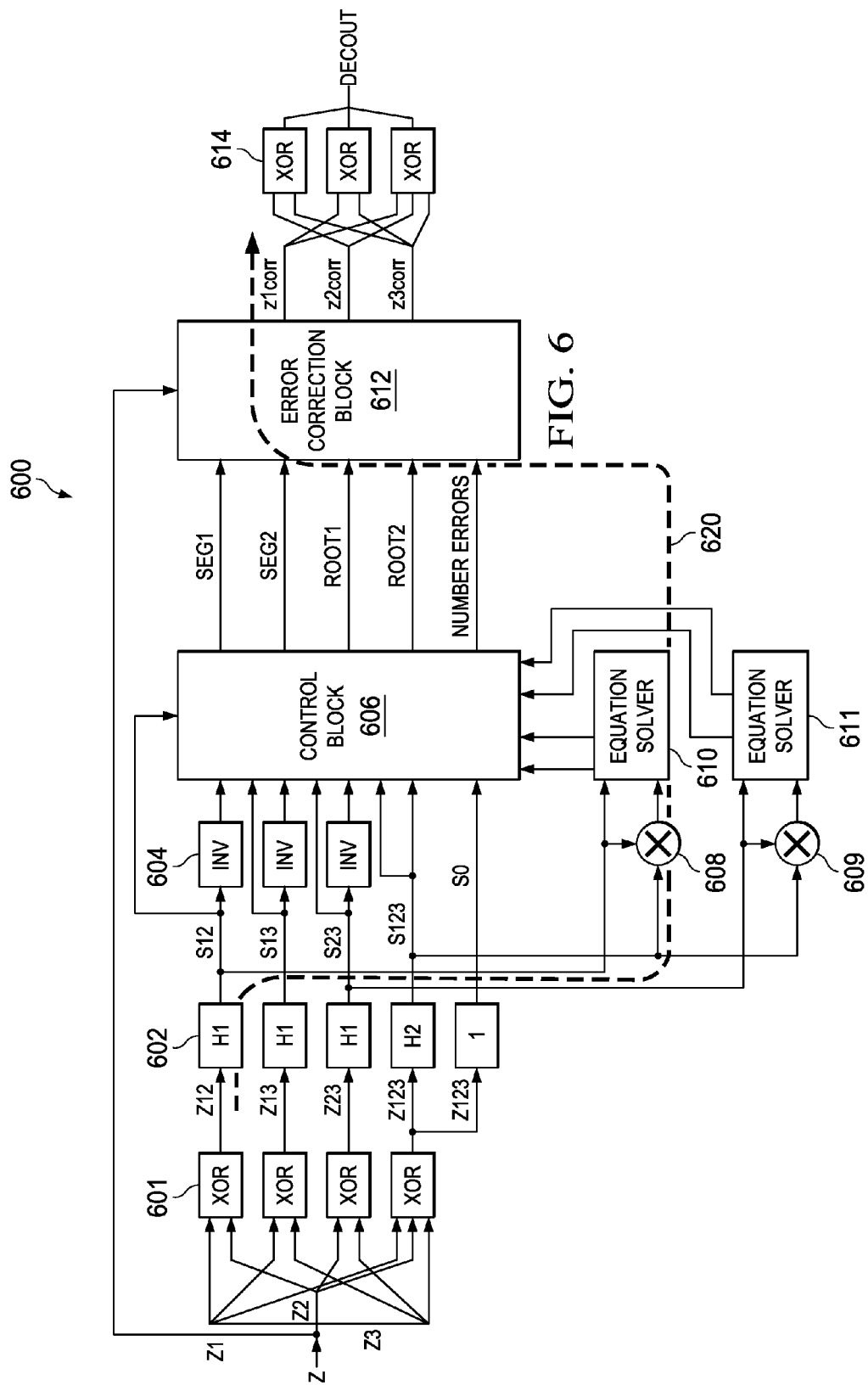
FIG. 6 is a block diagram of another embodiment of a decoder illustrating decoding a codeword that was encoded using three codeword segments.

FIG. 6 is a block diagram of another embodiment of a decoder 600 illustrating decoding a codeword that was encoded using three codeword segments. In this embodiment, each received codeword Z is segmented by segmentation module 601 as described above. All syndromes are computed first in the syndrome computation modules indicated generally at 602 using code matrix H1 and H2, as described in more detail above. Then $S_{12}$, $S_{13}$ and $S_{23}$ are inverted 604 and fed into controller 606 along with $S_{12}$, $S_{13}$, $S_{23}$, $S_{123}$, $S_0$ to determine the number of errors in each segment Z1-Z3, as described in more detail above.

In this embodiment, control block 606 is removed from the critical path to provide a parallelized 3-segment BCH decoder. Inverters 604 and control block 606 determines the number and locations of errors in a similar manner as described with regard to decoder 500. Separate equation solvers and multipliers are provided to process each segment in parallel with the operation of control block 606. The input of an equation solver may be one of $S_{12}$, $S_{13}$ and $S_{23}$ syndromes (for three cases: $S_{12}=S_{13}$, $S_{12}=S_{23}$, $S_{13}=S_{23}$). When two errors are spread out in two different segments, three independent equation solvers may be needed. However, the two cases $S_{12}=S_{13}$ and $S_{12}=S_{23}$ can be covered by $S_{12}$ simultaneously, therefore in this embodiment only two independent equations solvers 610, 611 with Galois field multipliers 608, 609 operate in parallel to process $S_{12}$ and $S_{13}$, respectively. In this example, syndrome word $S_1$ and syndrome word $S_{-1}$ are multiplied by a Galois field multiplier 608, 609. The product, $S_1 S_{-1}$, is then input into a look-up table 610, 611. For the parallel case $S_1=S_{12}$ and $S_{-1}=S_{123}$, the look-up table 610 solves the following quadratic equation:

$$x^2+x+1/(S_1 S_{-1})=0.$$

Figure 8:
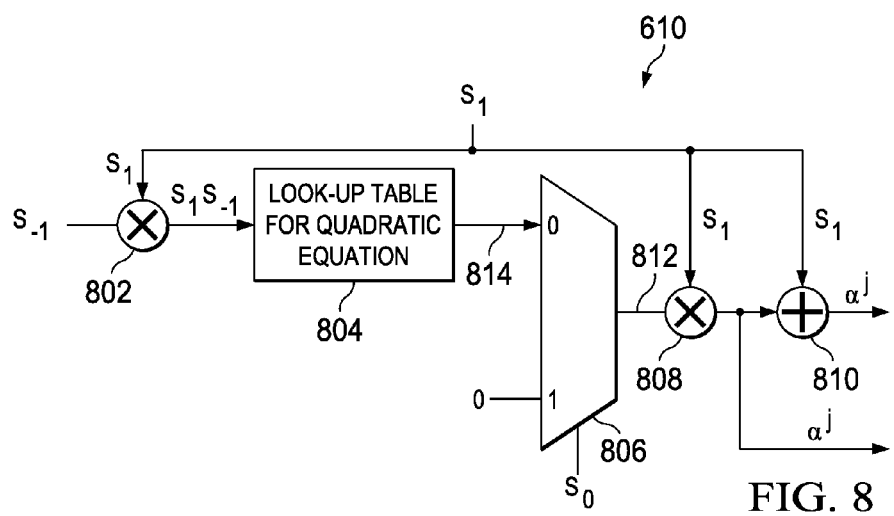
FIG. 8 is a more detailed block diagram of an equation solver.

The solution, $x_1$ to the above equation is output as root 1 and root 2 and form inputs 814 of multiplexer 806 in FIG. 8.

For the parallel case $S_1=S_{23}$ and $S_{-1}=S_{123}$, the look-up table 611 solves the following quadratic equation:

$$x^2+x+1/(S_1 S_{-1})=0.$$

The solution, $x_1$ to the above equation is output as root 1 and root 2 and form inputs 814 of the multiplexer 806.

Error correction block 612 searches for corresponding locations in the received codeword using the roots from equation solver 610, 611 and information about erroneous segments from control block 606, as described in more detail above. After the received bits $z_k$ in each of code word segments Z1-Z3 is corrected, data word $D=[d_{N-1}, d_{N-2}, \ldots d_1, d_0]$ is formed by XOR logic 614 according to equation (25) and is copied to the output of the decoder.

$$D=Z2_{CORR} \oplus Z3_{CORR}, Z1_{CORR} \oplus Z3_{CORR}, Z1_{CORR} \oplus Z2_{CORR} \oplus Z3_{CORR} \quad (25)$$

Although the area increases slightly due to additional equation solving path, now the critical path becomes syndrome computation 602, multiplier 608, equation solver 610, and multiplier-error correction block 612, as indicated by dotted line 620.

In this embodiment, critical path timing is improved by approximately 40% as compared to a traditional BCH decoder due to logic simplification due to using an Extended Bidirectional Hamming code (EBHC) described herein along with dividing the original data word into multiple segments that provides additional savings from smaller Galois field operation.

Figure 7:
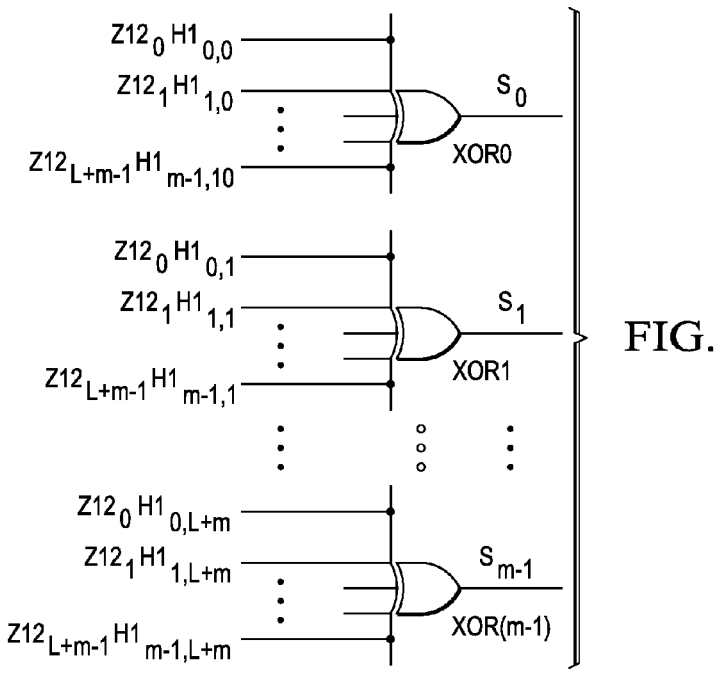
FIG. 7 is a schematic drawing of an embodiment of a syndrome bit generator using bit-wise XOR gates.

FIG. 7 is a schematic drawing of an embodiment of a syndrome bit generator using bit-wise XOR gates used in decoders 500, 600. In this example, the syndrome bits (syndrome vector) S12 are generated on a bit-wise basis using code matrix H1 defined by equation (18). Syndrome S23, S13, and S123 are formed in similar manner. Syndrome vector S12 is produced using matrix H1, equation (18), as shown in equation (26).

$$S12 = [1 \quad \alpha \quad \ldots \quad \alpha^{L+m-1}] \begin{bmatrix} Z12_0 \\ Z12_1 \\ \vdots \\ Z12_{L+m-1} \end{bmatrix} \quad (26)$$

The row vector actually represents a matrix of size $(m-1) \times (L+m)$. Each element of the row vector is an $(m-1)$ bit word represented by column. In this embodiment, exclusive OR function XOR0 applies the products of $H1*Z12^t$ on a bit-wise basis for column 0 with the output being equal to $S_0$. Exclusive OR function XOR1 applies the products of $H1*Z12^t$ on a bit-wise basis for column 1 with the output being equal to $S_1$. Each subsequent XOR repeats this pattern. Exclusive OR function XOR(m-1) applies the products of $H1*Z12^t$ on a bit-wise basis for column m-1 with the output being equal to $S_{m-1}$.

FIG. 8 is a more detailed block diagram of equation solver 610. Equation solver 612 is similar. In this example, syndrome word $S_1$ and syndrome word $S_{-1}$ are multiplied by a Galois field multiplier 802. The product, $S_1$ is then input into a look-up table 804. The look-up table 804 solves the following quadratic equation:

$$x^2+x+1/(S_1 S_{-1})=0.$$

The solution, $x_1$ to the above equation is output to node 814 and an input of the multiplexer 806. The other input to the multiplexer 806 is a logical zero.

When a single error occurs, $S_0=1$, the multiplexer outputs to node 812 a logical zero. The logic zero is multiplied by $S_1$ by Galois field multiplier 808 giving a logical zero for $\alpha^i$. The Galois field adder 810 adds the logical zero to $S_1$. As a result, $S_1=\alpha^j$ and $S_{-1}=\alpha^{-j}$.

When a double error occurs, $S_0=0$, $x_1$ is transferred to node 812 from node 814. $x_1$ is then multiplied by $S_1$ by Galois field multiplier 808 giving the following result for $\alpha^i$: $\alpha^i=x_1 S_1$. $\alpha^i$ is then added by Galois field adder 810 to $S_1$ with the following result for $\alpha^j$: $\alpha^j=S_1+\alpha^i$.

Figure 9:
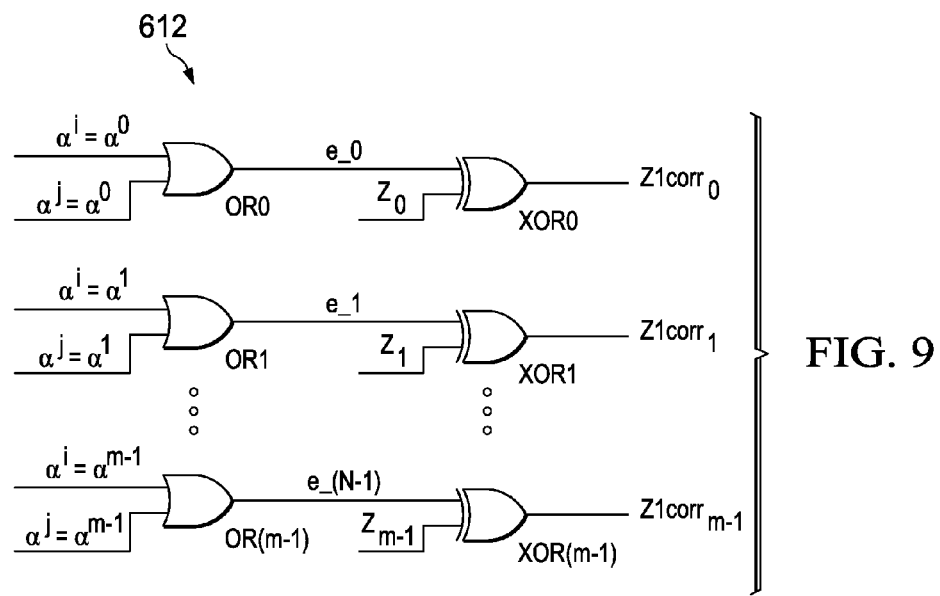
FIG. 9 is a schematic drawing of an embodiment of logic for correcting one and two error in a received code word.

FIG. 9 is a schematic drawing of an embodiment of error correction logic 614 for correcting one and two error in a received code word segment. This example is for segment Z1, the other segments are similar. Error control block 612 flips a bit at location i in segment k if root1=alpha^i and seg1=k or if root2=alpha^i and seg2=k. In this embodiment two-input OR gates and two-input XOR gates are used in a bit-wise manner for each of the three segments. $\alpha^i$ and $\alpha^j$ (root1 and root2) are received from the outputs of control block 606 and are coupled to the two inputs of the OR gates, OR0—OR(m−1). The outputs e_0-e_(m−1) are coupled to inputs of the two-input XOR gates XOR0—XOR(m−1). The other inputs of the two-input XOR gates XOR0—XOR(m−1) are coupled to received code bits $z_0$-$z_{m-1}$. When one or two errors occur in code word segment Z1 and the error(s) are located at $\alpha^i$ and $\alpha^j$, the decoder will correct bit $z_k$ (k=0, 1 ... m−1) by inverting bit $z_k$ when $\alpha^j=\alpha^k$ to form corrected segment $Z1_{CORR}$.

After the received bit $z_k$ in each of code word segments Z1-Z3 is corrected, data word D=[$d_{N-1}$, $d_{N-2}$, ... $d_1$, $d_0$] is formed by XOR logic 614 and is copied to the output of the decoder, as described in more detail above.

Because an embodiment of this invention places roots of the code word polynomial at −1, 0 and 1 powers of primitive Galois Field element α instead of using known methods where the roots are placed at 0, 1 and 3 powers of primitive Galois Field element α, the complexity of the decoder is reduced and the delay time of a signal propagating through the decoder is reduced. Furthermore, by using multiple coding segments, two coding matrices may be used to produce roots at −1 for two segments and roots at 0 and −1 for the third segment. This not only simplifies decoder implementation for double bit error correction but also provides 3-error detection capability because of additional root at alpha^0.

System Examples

Figure 10:
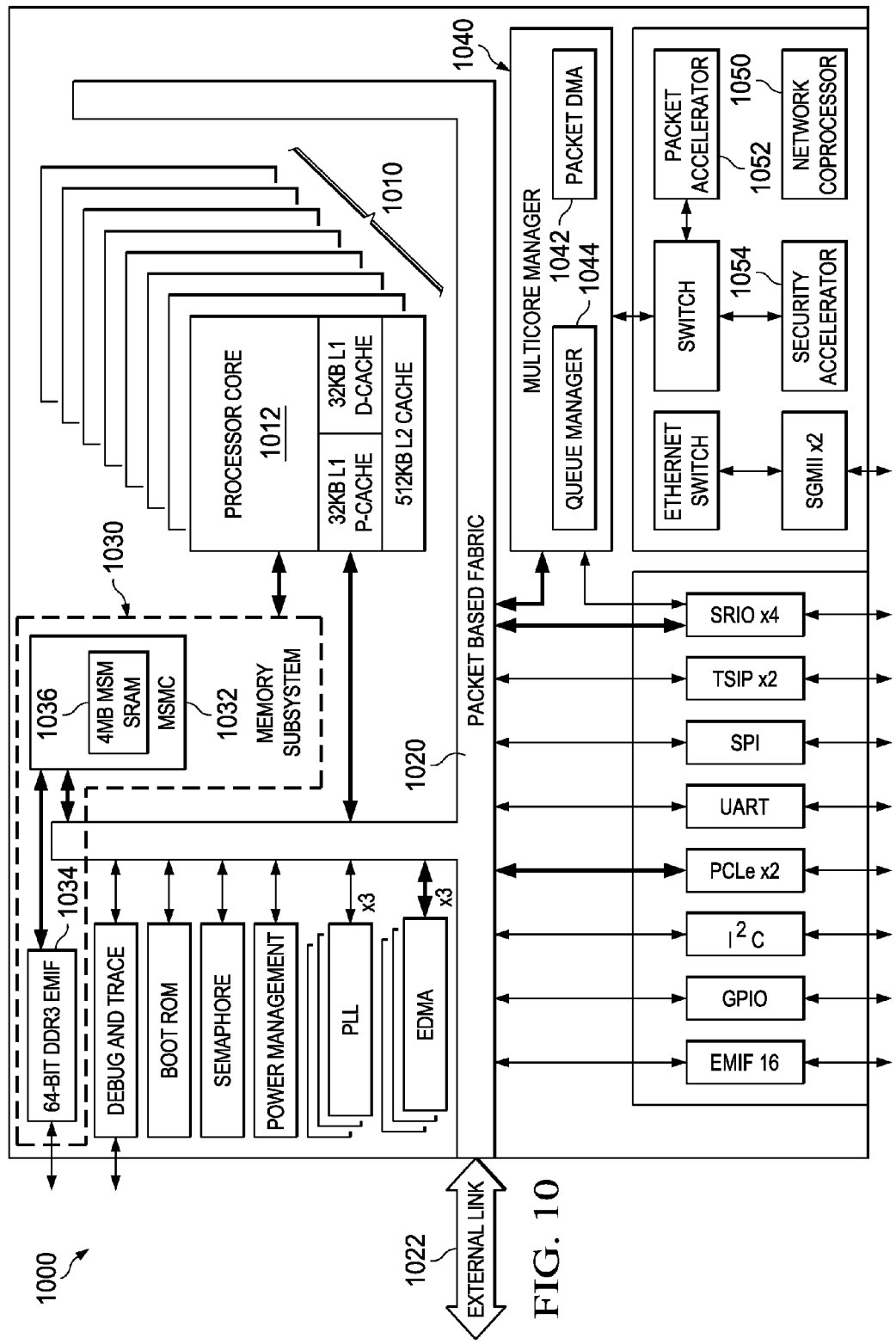
FIG. 10 is a block diagram of a system on a chip that embodies double error correction and triple error detection using three codeword segments.

FIG. 10 is a block diagram of a system on a chip (SoC) 1000 that embodies double error correction and triple error detection using three codeword segments, as described herein. High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision.

System 1000 is a multi-core SoC that includes a set of processor modules 1010 that each include a processor core, level one (L1) data and instruction caches, and a level two (L2) cache. Embodiments of SoC 1000 may include error correction and detection as described in more detail above within the L1 and/or L2 caches. In this embodiment, there are eight processor modules 1010; however other embodiments may have fewer or greater number of processor modules. In this embodiment, each processor core is a digital signal processor (DSP); however, in other embodiments other types of processor cores may be used. A packet-based fabric 1020 provides high-speed non-blocking channels that deliver as much as 2 terabits per second of on-chip throughput. Fabric 1020 interconnects with memory subsystem 1030 to provide an extensive two-layer memory structure in which data flows freely and effectively through processor modules 1010

External link 1022 provides direct chip-to-chip connectivity for local devices, and is also integral to the internal processing architecture of SoC 1000. External link 1022 is a fast and efficient interface with low protocol overhead and high throughput, running at an aggregate speed of 50 Gbps (four lanes at 102.5 Gbps each). Working in conjunction with a routing manager 1040, link 1022 transparently dispatches tasks to other local devices where they are executed as if they were being processed on local resources. Embodiments of SoC 1000 may include error correction and detection as described in more detail above for data sent and received over external link 1022.

There are three levels of memory in the SoC 1000. Each processor module 1010 has its own level-1 program (L1P) and level-1 data (L1D) memory. Additionally, each module 1010 has a local level-2 unified memory (LL2). Each of the local memories can be independently configured as memory-mapped SRAM (static random access memory), cache or a combination of the two.

In addition, SoC 1000 includes shared memory subsystem 1030, comprising internal and external memory connected through the multicore shared memory controller (MSMC) 1032. MSMC 1032 allows processor modules 1010 to dynamically share the internal and external memories for both program and data. The MSMC internal RAM offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches. Embodiments of SoC 1000 may include error correction and detection as described in more detail above within MSMC 1032.

External memory may be connected through the same memory controller 1032 as the internal shared memory, rather than to chip system interconnect as has been traditionally been done on embedded processor architectures, providing a fast path for software execution. In this embodiment, external memory may be treated as SL3 memory and therefore cacheable in L1 and L2.

SoC 1000 may also include several coprocessing accelerators that offload processing tasks from the processor cores in processor modules 1010, thereby enabling sustained high application processing rates. SoC 1000 may also contain a network coprocessor block 1050 that may include a packet accelerator 1052 and a security accelerator 1054 that work in tandem. The packet accelerator speeds the data flow throughout the core by transferring data to peripheral interfaces such as the Ethernet ports or Serial RapidIO (SRIO) without the involvement of any module 1010's DSP processor. The security accelerator provides security processing for a number of popular encryption modes and algorithms, including IPSec, SCTP, SRTP, 3GPP, SSL/TLS and several others.

Multicore manager 1040 provides single-core simplicity to multicore device SoC 1000. Multicore manager 1040 provides hardware-assisted functional acceleration that utilizes an a packet-based hardware subsystem. With an extensive series of more than 8,000 queues managed by queue manager 1044 and a packet-aware DMA controller 1042, it optimizes the packet-based communications of the on-chip cores by practically eliminating all copy operations.

Other Embodiments

While the invention has been described with reference to illustrative embodiments, this description is not intended to be construed in a limiting sense. Various other embodiments of the invention will be apparent to persons skilled in the art upon reference to this description. For example, although the invention finds particular application a System on a Chip (SoC), it also finds application to other forms of digital systems. A SoC may contain one or more megacells or modules which each include custom designed functional circuits combined with pre-designed functional circuits provided by a design library.

An embodiment may be a memory device that includes error detection and correction as described herein.

An embodiment may include several integrated circuits (IC) in which error detection and correction logic in one IC may be used to correct memory in another IC, for example.

An embodiment may be any type of system that stores or transmits data, such as a personal computer, a mainframe computer, a laptop computer, a tablet computer, a smart phone, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A system with memory error correction and detection comprising:
an error detection and correction (EDC) module configured to receive a code word derived from a plurality of smaller code words that represent a data word of $2^m$ data bits and a plurality of error correction code bits, wherein the EDC module comprises:
segmentation logic coupled receive the code word, the segmentation logic configured to convert the code word into a plurality of smaller code words;
syndrome computation logic configured to multiply each of the plurality of smaller code words by a check matrix to form a plurality of syndromes words;
a control block coupled to receive and process the plurality of syndrome words to determine a number of errors that exist in each of the plurality of smaller code words;
a plurality of equation solver modules coupled to each receive and process a portion of the plurality of syndrome words in parallel with the control block to determine locations of possible errors within the plurality of smaller code words; and
an error correction block coupled to receive the number of errors from the control block and the locations of possible errors from the equation solver module, the error correction block being configured to correct up to two errors and to detect up to three errors in the code word.

2. The system of claim 1, wherein the segmentation logic converts the code word into three smaller code words.

3. The system of claim 2, wherein the syndrome computation logic uses two coding matrices to produce roots at −1 power of primitive Galois Field element $\alpha$ for two segments and roots at 0 and −1 powers of primitive Galois Field element $\alpha$ for the third segment.

4. The system of claim 1, wherein the received code word polynomial has roots at −1, 0 and 1 powers of primitive Galois Field element $\alpha$.

5. The system of claim 1, wherein the syndrome computation logic multiplies a portion of the smaller code words by a matrix H1, where $\alpha$ is a root of an irreducible polynomial over the Galois field $FG(2^m)$; and $$H1 = [1\, \alpha\, \ldots\, \alpha^{N-1}].$$

6. The system of claim 5, wherein the syndrome computation logic multiplies a portion of the smaller code words by a matrix H2, where $$H2 = \begin{bmatrix} 1 & 1 & \ldots & 1 \\ 1 & \alpha^{-1} & \ldots & \alpha^{-(N-1)} \end{bmatrix}.$$

7. The system of claim 1, further comprising a memory circuit coupled to the configured to store at least one code word derived from a plurality of smaller code words that represent a data word of $2^m$ data bits and a plurality of error correction code bits.

8. The system of claim 7, further comprising a central processing unit (CPU) coupled to the EDC module and memory circuit, wherein the CPU and the memory circuit are formed on a single substrate within a system on a chip.

9. The system of claim 1, further comprising a serial receiver configured to receive the code word from an external source.

10. A method for decoding a received code word by an error detection and correction module, the method comprising:
receiving a code word from a memory circuit, wherein the code word was derived from a plurality of smaller code words that represent a data word of $2^m$ data bits and a plurality of error correction code bits;
converting the code word into the plurality of smaller code words;
computing a plurality of syndromes by multiplying each of the plurality of smaller code words by a check matrix;
processing the plurality of syndrome words to determine a number of errors that exist in each of the plurality of smaller code words;

processing a portion of the plurality of syndrome words to determine locations of possible errors within the plurality of smaller code words; and correcting up to two errors and detecting up to three errors in the code word by using the number of errors and the locations of possible errors to determine erroneous bits in the code word.

11. The method of claim 10, wherein the code word is converted into three smaller code words.

12. The method of claim 11, wherein computing the plurality of syndromes uses two coding matrices to produce roots at −1 powers of primitive Galois Field element α for two segments and roots at 0 and −1 powers of primitive Galois Field element α for the third segment.

13. The method of claim 10, wherein the received code word polynomial has roots at −1, 0 and 1 powers of primitive Galois Field element α.

14. The method of claim 10, wherein computing the plurality of syndrome words comprises multiplying a portion of the smaller code words by a matrix H1, where α is a root of an irreducible polynomial over the Galois field FG($2^m$); and $H1 = [1\, \alpha \ldots \alpha^{N-1}]$.

15. The method of claim 14, wherein computing the plurality of syndrome words comprises multiplying a portion of the smaller code words by a matrix H2, where $$H2 = \begin{bmatrix} 1 & 1 & \ldots & 1 \\ 1 & \alpha^{-1} & \ldots & \alpha^{-(N-1)} \end{bmatrix}.$$

16. The method of claim 10, wherein processing the plurality of syndrome words to determine a number of errors and processing a portion of the plurality of syndrome words to determine locations of possible errors are performed in parallel.

17. The method of claim 10, further comprising providing the corrected data word for use by a processing unit on a system on a chip.

18. A method for encoding a data word for error detection and correction, the method comprising:

dividing the data word into three segments;

generating three codewords respectively from each of the three segments;

generating a composite codeword using multiple combinations of three codewords; and storing or transmitting the composite codeword.

19. The method of claim 18, wherein the composite code word polynomial has roots at −1, 0 and 1 powers of primitive Galois Field element α.

20. The method of claim 18, wherein:

generating the three codewords comprising inserting a number d of dummy bits to make all three segments a same length; and generating a composite codeword comprises deleting the number d bits from the composite codeword.

* * * * *